(12) United States Patent
Yang

(10) Patent No.: US 6,306,700 B1
(45) Date of Patent: Oct. 23, 2001

(54) METHOD FOR FORMING HIGH VOLTAGE DEVICES COMPATIBLE WITH LOW VOLTAGES DEVICES ON SEMICONDUCTOR SUBSTRATE

(75) Inventor: Sheng-Hsiung Yang, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/633,468

(22) Filed: Aug. 7, 2000

(51) Int. Cl.[7] .................................................... H01L 21/38
(52) U.S. Cl. ............................................. 438/217; 438/289
(58) Field of Search ................................... 438/287, 288, 438/289, 290, 291, 297, 223, 224, 203, 305, 199, 227, 228, 217, 261, 216

(56) References Cited

U.S. PATENT DOCUMENTS 5,424,226 * 6/1995 Vo et al. ................................ 438/289
6,096,589 * 8/2000 Lee et al. ............................... 438/225

* cited by examiner

Primary Examiner—Amir Zarabian
Assistant Examiner—Beth E. Owens

(57) ABSTRACT

A method for forming high voltage devices compatible with low voltage devices on a semiconductor substrate is provided. A substrate is provided. An oxide layer is formed on the substrate. An N well is formed in the substrate. A P well is formed opposite to the N well in the substrate. A plurality of N-field regions are formed as drift regions in the P well and as isolation regions in the N well. A plurality of P-field regions are formed as drift regions in the N well and as isolation regions in the P well region. A plurality of field oxide regions are formed on the N well and the P well in the substrate. N$^-$ type doped regions are formed in the P well through an N-grade implantation, prior to a gate oxide layer and a polysilicon layer formation. An N$^+$ type doped region in the N$^-$type doped region is formed as a source/drain region for an NMOS transistor in the P well. A P$^+$ type doped region is formed as a source/drain region for a PMOS transistor in the N well. The polysilicon layer is formed and defined as a gate on the gate oxide layer across a channel for the NMOS/PMOS transistor and a portion of the field oxide region adjoining thereto.

15 Claims, 8 Drawing Sheets

US 6,306,700 B1

METHOD FOR FORMING HIGH VOLTAGE DEVICES COMPATIBLE WITH LOW VOLTAGES DEVICES ON SEMICONDUCTOR SUBSTRATE

BACKGROUND OF THE INVENTION

1. Field of the Invention

The present invention relates to a method for forming semiconductor devices, and more particularly to a method for forming high voltage devices compatible with low voltage devices on a semiconductor substrate.

2. Description of the Prior Art

Recently, the demand for semiconductor devices has rapidly increasing due to the usage of a large number of electronic devices. The integrated circuits for computer peripherals, such as output/input circuits or watcher circuits, require a controlling circuit and a driving circuit. In general, low voltage devices are utilized in the controlling circuit, while high voltage devices are utilized in the driving circuit. However, the high/low voltage-integrated devices are also utilized in many other devices, such as an LCD display for a notebook, electronic parts for a watch etc., except for the computer peripherals. Therefore, it is frequent to utilize high/low voltage-integrated devices in semiconductor devices.

FIG. 1A to FIG. 1C show cross-sectional views respectively for various steps of the method for forming a conventional high voltage device according to the current deep-submicron technique. In FIG. 1A, firstly, N wells 102 and 104 are formed in the substrate 100 through an N well blank implantation. The N wells 102 and 104 are generally formed by an N type ion implantation, for example, phosphorus or arsenic ion implantation. In FIG. 1B, subsequently, a well compensation process is performed to compensate the N well 102 to a P well 106 for an NMOS transistor in the substrate 100. The well compensation process is performed, utilizing a P type ion implantation, for example, boron ion implantation. For the N type ion implantation, phosphorus or arsenic ion prefers closing to the surface of the N well. While, for the P type ion implantation, boron ion prefers far away from the surface of the P well. Hence, well compensation for the N well 102 compensated to the P well 106 would result in non-uniform concentration distribution for the P well 106. An additional well compensation is required.

In FIG. 1C, a gate oxide layer 108 and a polysilicon gate 110 are formed on the substrate 100, prior to forming N$^-$type doped regions 112a and 112b. Since the N-grade implantation to form N$^-$type doped regions 112a and 112b is subsequent to the formation of the polysilicon gate 110, the N$^-$type doped regions 112a and 112b are subject to only one thermal cycle, e.g. an annealing process. Thus, the diffusion depth of the N$^-$type doped regions 112a and 112b is shallow. Moreover, as described in the above, the doped concentration of the compensated P well 106 is not uniform, due to the previous N well blank implantation. Hence, it is difficult to obtain a good doping profile for the snap-back voltage, and therefore, the hot carrier effect is not easily controlled.

Accordingly, it is an intention to find out a method for forming high/low voltage-integrated device to overcome the drawbacks of the conventional device.

It is one object of the present invention to provide a method for forming high voltage devices compatible with low voltage devices on a semiconductor substrate, in which a single N well and P well are formed as wells sufficient for a respective high voltage device and a respective low voltage device. Hence, it is not required for well compensation, and the number of masks for ion implantation is decreased.

It is another object of the present invention to provide a method for forming high voltage devices compatible with low voltage devices on a semiconductor substrate, in which an N-grade implantation is performed to form N$^-$type doped regions in a P well, prior to a gate oxide layer and a polysilicon gate formation. By this method a better doping profile for the snap-back voltage is obtained and the breakdown voltage is increased.

SUMMARY OF THE INVENTION

To achieve these objects and advantages, and in accordance with the purpose of the invention, as embodied and broadly described herein, the invention is directed towards a method for forming high voltage devices compatible with low voltage devices on a semiconductor substrate. A substrate is provided. An oxide layer is formed on the substrate. An N well is formed in the substrate. A P well is formed in the substrate opposite to the N well. A plurality of N-field regions are formed as drift regions in the P well and as isolation regions in the N well. A plurality of P-field regions are formed as drift regions in the N well and as isolation regions in the P well region. A plurality of field oxide regions are formed on the N well and the P well in the substrate. N$^-$type doped regions are formed in the P well through an N-grade implantation, prior to a gate oxide layer and a polysilicon layer formation. An N$^+$type doped region in the N$^-$type doped region is formed as a source/drain region for an NMOS transistor in the P well. A P$^+$type doped region is formed as a source/drain region for a PMOS transistor in the N well. The polysilicon layer is formed and defined as a gate on the gate oxide layer across a portion of the field oxide region and a portion of the P/N well adjoining thereto.

BRIEF DESCRIPTION OF THE DRAWINGS

The foregoing objects and attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A preferred embodiment of the present invention provides a method for forming high voltage devices compatible with low voltage devices on a semiconductor substrate. The preferred embodiment is illustrated in FIG. 2 to FIG. 6.

Figure 1A:
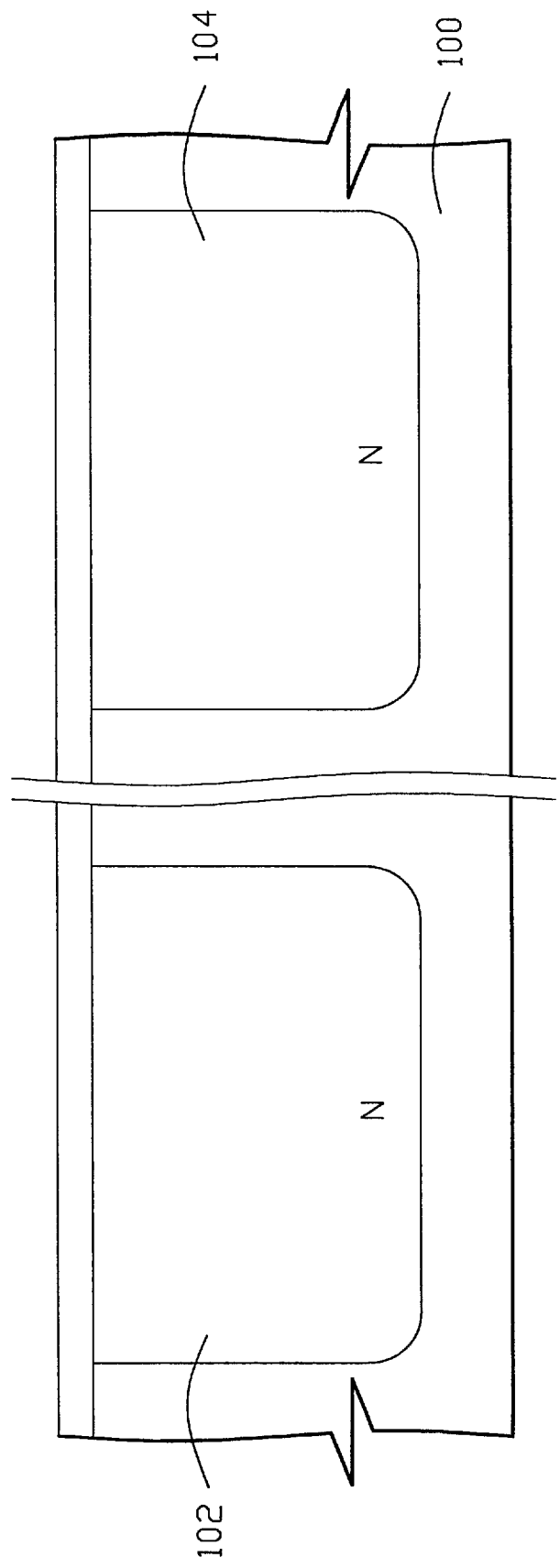
FIG. 1A to FIG. 1C show respective cross-sectional views for a method for forming high voltage devices on a semiconductor substrate in the prior art.
Figure 1B:
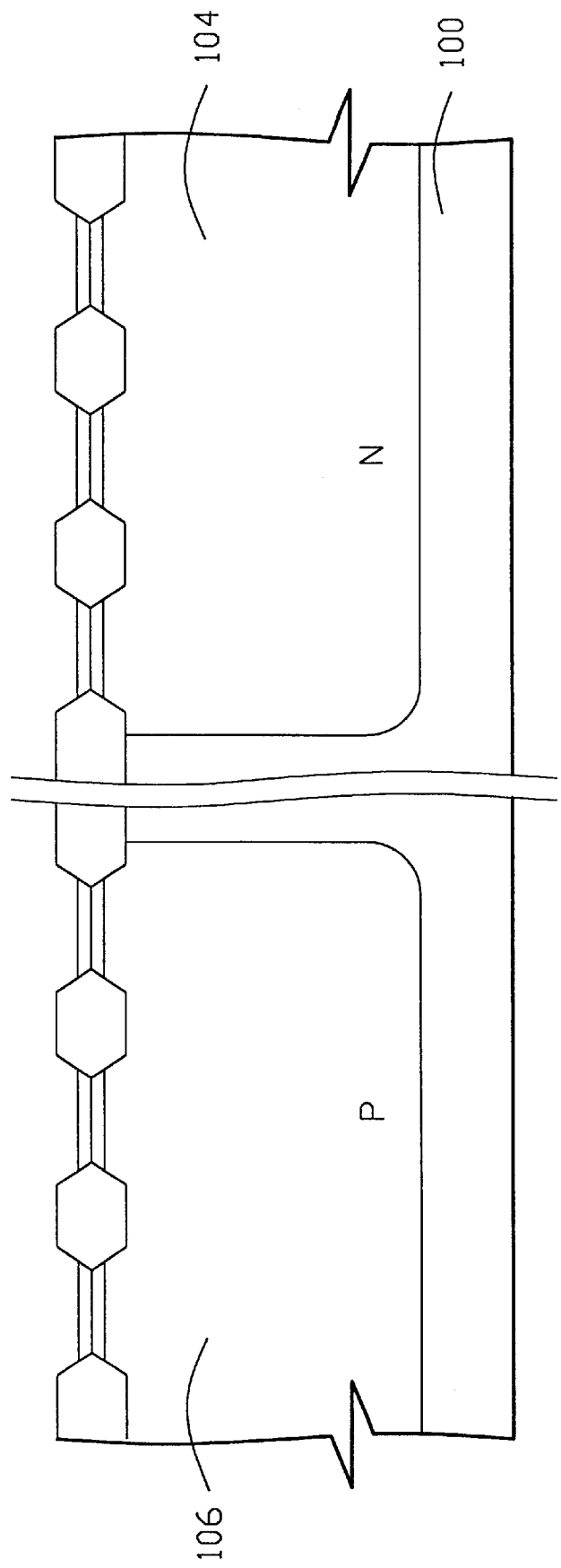
Figure 1C:
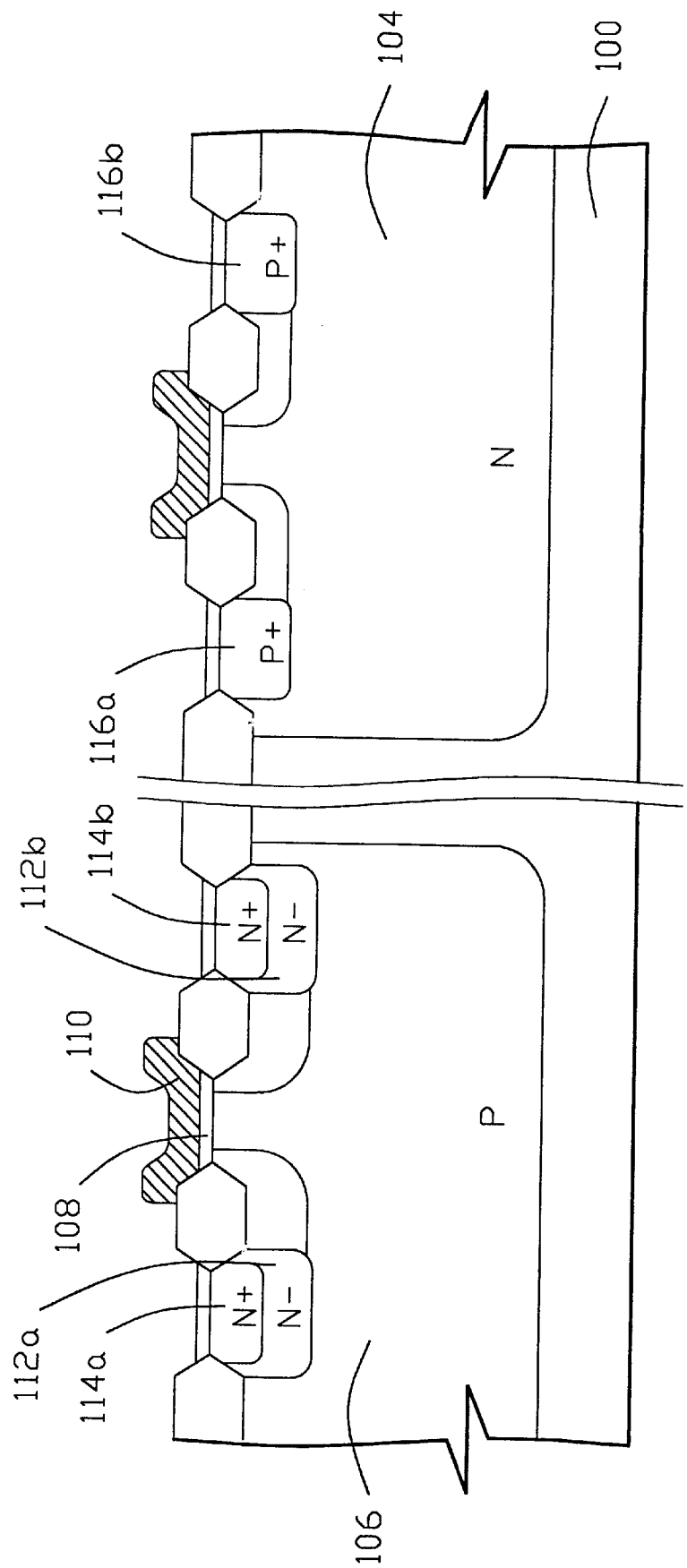
Figure 2:
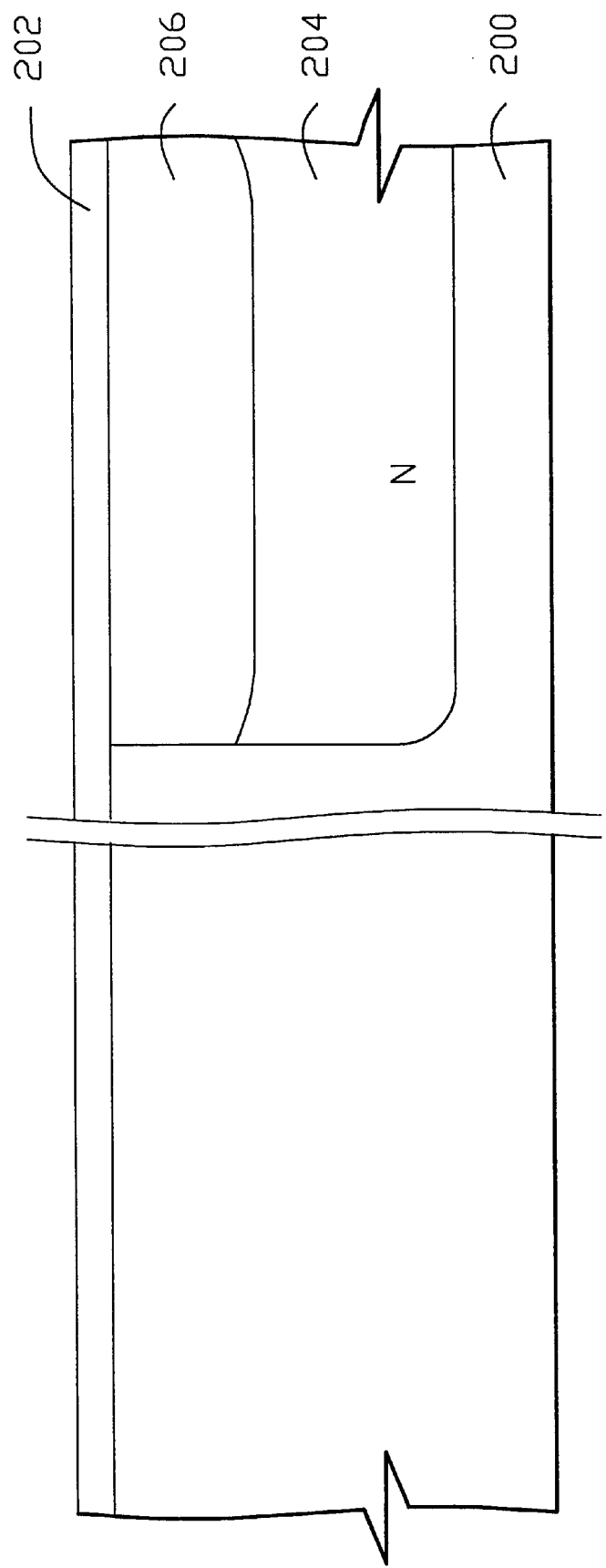
FIG. 2 to FIG. 6 are cross-sectional views respectively illustrating a method for fabricating one preferred embodiment of the present invention.

First of all, a semiconductor substrate 200 is provided with a P$^-$type conductivity, as shown in FIG. 2. Continuously referring to FIG. 2, an oxide layer 202 with a thickness about 3000~7000 angstroms is formed on the substrate 200. The oxide layer 202 can be a silicon dioxide layer, formed by chemical vapor deposition, e.g. plasma enhanced chemical vapor deposition (PECVD), low pressure chemical vapor deposition (LPCVD) or atmospheric pressure chemical vapor deposition (APCVD). Using a mask on one upper-half portion of the substrate 200, a first ion implantation and drive-in process is performed, so that an N well 204 is formed in the substrate 200. Then, a second ion implantation and thermal process is performed to form a PMOS antipunchthrough (PAPT) well 206 with a thickness about 0.2~0.4 µm in the N well 204. An annealing process can be utilized as the thermal process. The PAPT well 206 functions as prevention for punchthrough to occur between the source and drain regions for a PMOS transistor in the N well 204.

Figure 3:
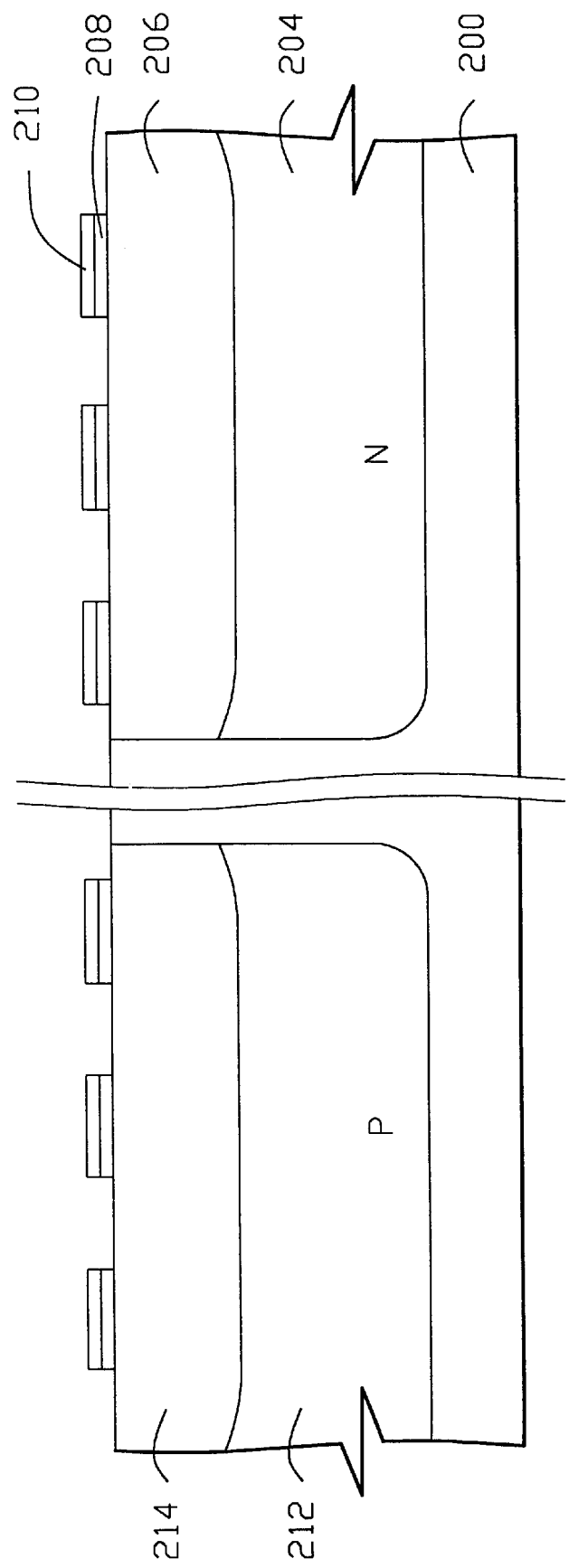

Referring to FIG. 3, the oxide layer 202 on the substrate 200 is removed. A pad oxide layer 208 and a silicon nitride layer 210 are formed and defined on the substrate 200 to partially expose the PAPT well 206 in the N well 204 and the substrate 200. Using a mask on the PAPT well 206, a third ion implantation and drive in process is performed, so that a P well 212 is formed in the substrate 200. In this embodiment, the P well 212 is more heavily doped than the substrate 200. Then, a fourth ion implantation and thermal process is performed to form an NMOS anti-punchthrough well (NAPT) 214 with a thickness about 0.2~0.4 µm in the P well 212. An annealing process can be utilized as the thermal process. The NAPT well 214 functions as prevention for punchthrough to occur between the source and drain regions for an NMOS transistor in the P well 212.

Figure 4:
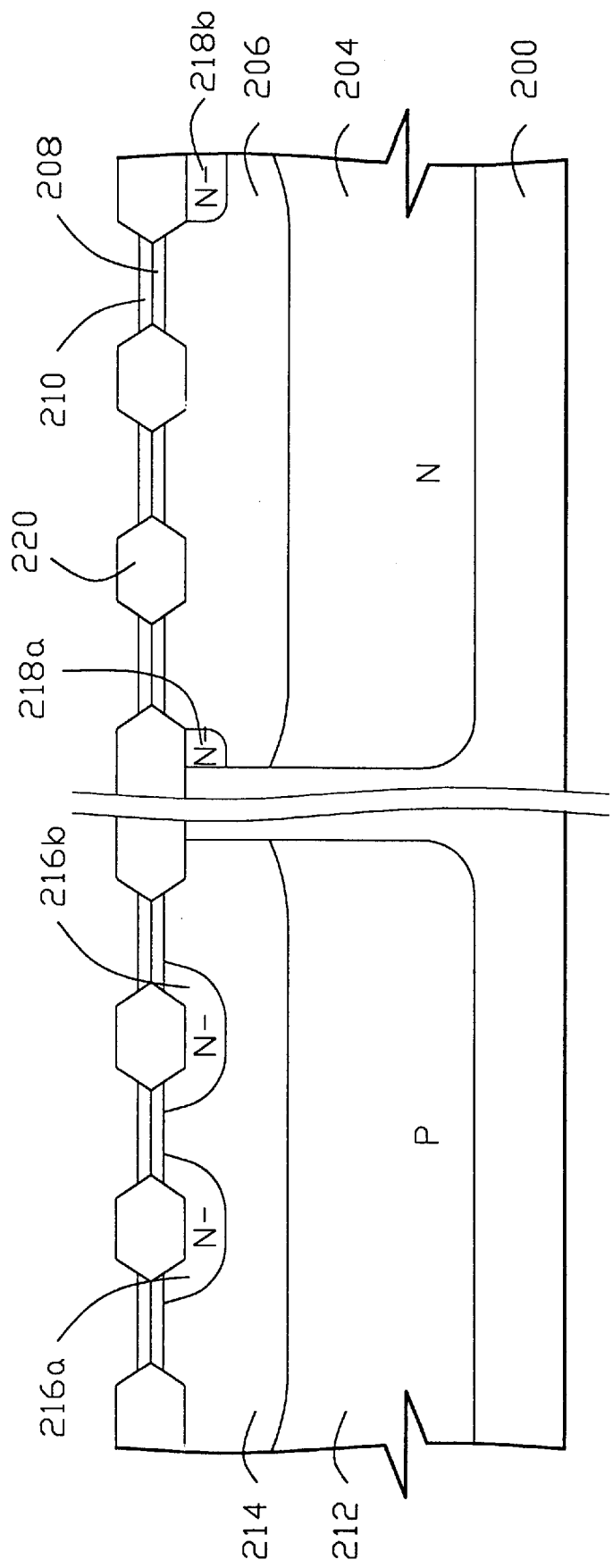

Referring to FIG. 4, using a mask, an N-field implantation is performed to form N$^-$type doped regions 216a and 216b as drift regions in the NAPT well 214 and N-type doped regions 218a and 218b as isolation regions in the PAPT well 206. The doping concentration of the N-field implantation is about $1 \times 10^{16} \sim 3 \times 10^{17}/cm^3$. Then, a plurality of field oxide regions 220 are formed on the defined substrate 200, for example, by thermally oxidizing the exposed substrate 200, that is, the exposed PAPT well 206 and NAPT well 214.

Figure 5:
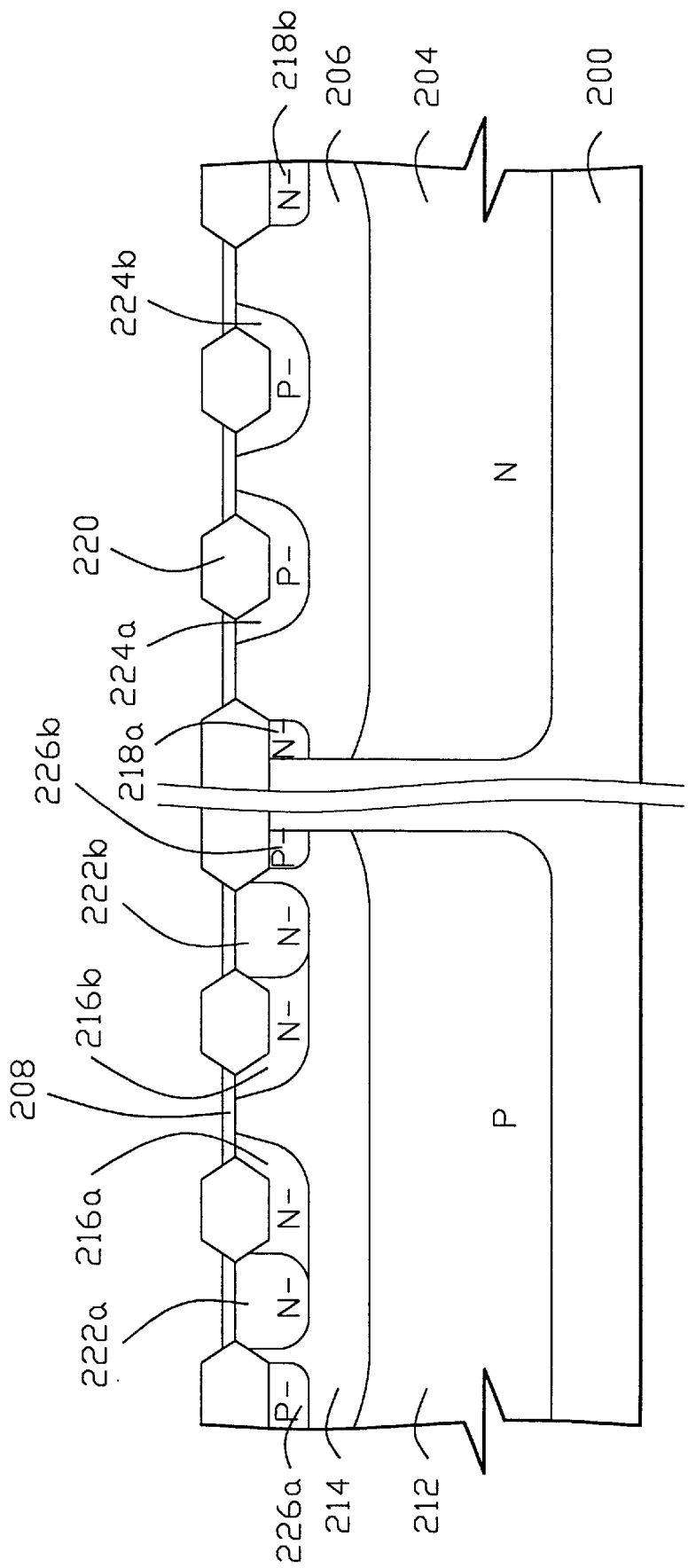

Referring to FIG. 5, the silicon nitride layer 210 is removed. Then, using a mask, an N-grade implantation is performed to form N$^-$type doped regions 222a and 222b in the NAPT well 214. The doping concentration of the N-grade implantation is about $1 \times 10^{16} \sim 3 \times 10^{17}/cm^3$. Using a mask, a P-field implantation is performed to form P- type doped regions 224a and 224b as drift regions in the PAPT well 206 and P- type doped regions 226a and 226b as isolation regions in the NAPT well 214. The doping concentration of the P-field implantation is about $1 \times 10^{16} 5 \times 10^{17}/cm^3$.

Figure 6:
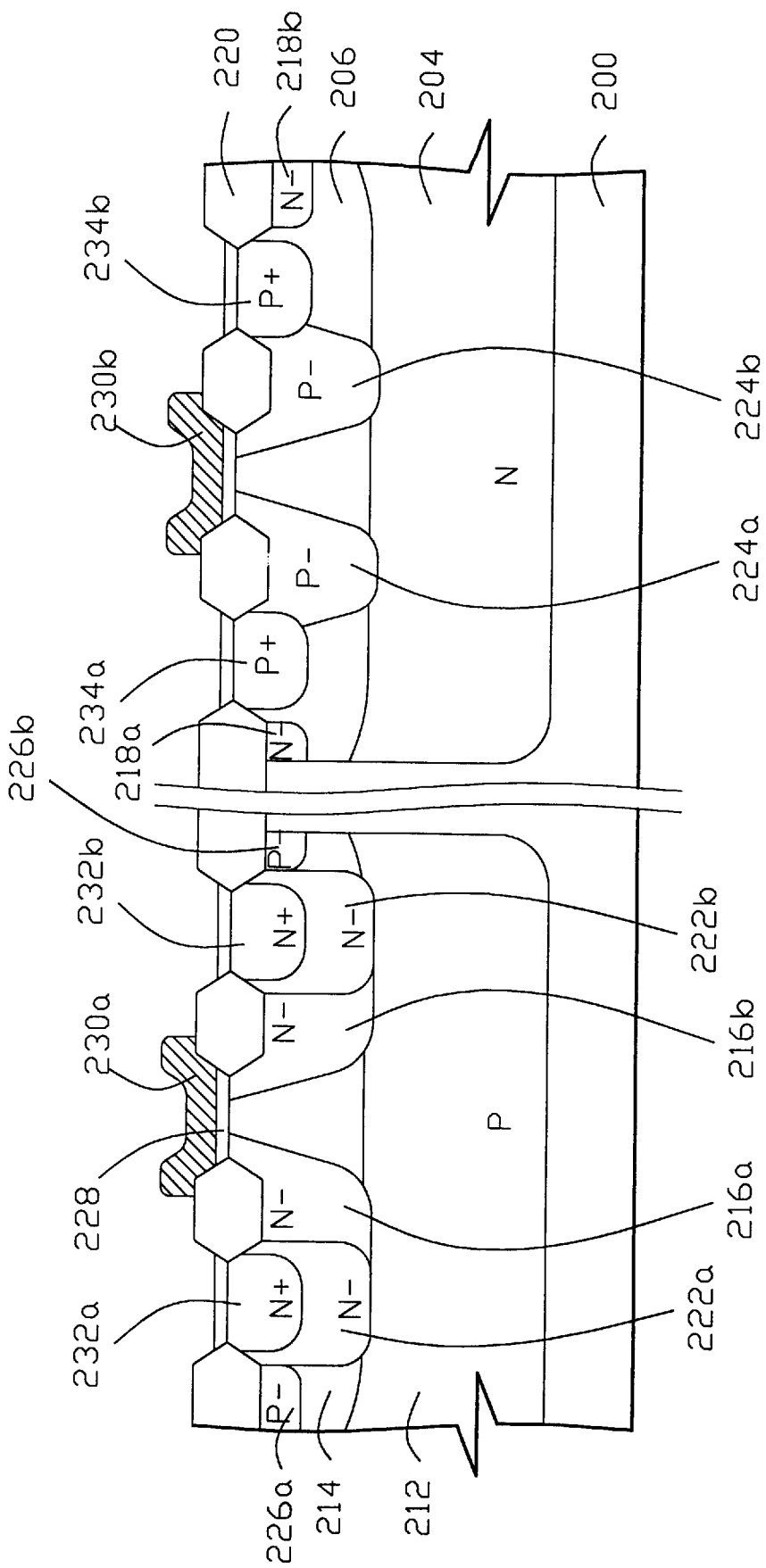

Referring to FIG. 6, after removing the pad oxide layer 208, a V$_T$ ion implantation is optionally performed to control the threshold voltage. A gate oxide layer 228 is formed on the substrate 200. A polysilicon layer as a gate 230a /230b is formed across a part of the field oxide region 220 and a part of the NAPT well 214 /the PAPT well 206 adjoining thereto. Finally, using a mask, a sixth ion implantation is performed to form N$^+$type doped regions 232a and 232b in the N$^-$type doped regions 222a and 222b, which are respectively served as source and drain regions for an NMOS transistor in the P well 212. The doped concentration of the N$^+$doped regions 232a and 232b is about $9 \times 10^{14} \sim 7 \times 10^{15}/cm^3$. Using a mask, a seventh ion implantation is performed to form P$^+$type doped regions 234a and 234b, which are respectively served as source and drain regions for a PMOS transistor in the N well 204. The doped concentration of the P$^+$doped regions 234a and 234b is about $8 \times 10^{14} \sim 5 \times 10^{15}/cm^3$. The processes for forming the gate oxide layer 228 and the polysilicon gate 230a and 230b are performed at the high temperatures, which facilitate dopant diffusion. The N$^-$type doped regions 216a, 216b, 222a and 222b, as well as P$^-$type doped regions 224a and 224b are formed as deeper diffusion regions, even diffused into the substrate 200. Thus, a better doping profile for the snap-back voltage is provided, and the breakdown voltage is increased. The vertical transportation of carriers toward the substrate 200 is prevented, so that the formation of a parasitic bipolar junction transistor is avoided, and the hot carrier effect is controlled well. Accordingly, a high voltage device for 20–100 volts compatible with a low voltage device on a semiconductor substrate is provided.

Moreover, it is not required to proceed well compensation for the present method. The number of masks used for ion implantation is also decreased.

In this embodiment, the "N$^+$" represents an N-type dopant with a heavy dopant concentration and the "N$^-$" represents an N-type dopant with a light dopant concentration. On the other hand, the "P$^+$" represents a P-type dopant with a heavy dopant concentration and the "P$^-$" represents a P-type dopant with a light dopant concentration.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming high voltage devices compatible with low voltage devices on a semiconductor substrate, comprising steps of:

forming an oxide layer on a substrate;

forming an N well in the substrate by using a mask on one upper-half portion of the substrate;

sequentially forming a pad oxide layer and a silicon nitride layer on the substrate;

defining said pad oxide layer and said silicon nitride layer to partially expose the substrate;

forming a P well opposite to said N well in the substrate by using a mask on said N well in the substrate;

using a mask and forming a plurality of N-field regions as drift regions which respectively cover a portion of a channel for an NMOS transistor in said P well and a plurality of N-field regions as isolation regions which respectively neighbor with a source/drain region for a PMOS transistor in said N well;

forming a plurality of field oxide regions on exposed portions of the substrate;

using a mask and forming an N$^-$type doped region between two said field oxide regions for enclosing the source/drain region for the NMOS transistor in said P well;

using a mask and forming a plurality of P-field regions in said N well as drift regions which respectively cover a portion of a channel for a PMOS transistor in said N well and underlay said field oxide regions adjoining the channel, and a plurality of P-field regions in said P well as isolation regions which respectively underlay said field oxide regions adjoining the source/drain region;

forming a gate oxide layer on the substrate;

forming a polysilicon gate on said gate oxide layer, said polysilicon gate crossing the channel and a portion of said field oxide regions adjoining thereto, respectively on said P well and said N well;

using a mask and forming an N$^+$ type doped region in said N-type doped region as the source/drain region for the NMOS transistor in said P well; and using a mask and forming a P+ type doped region between two said field oxide regions in said N well as the source/drain region for the PMOS transistor in said N well.

2. The method according to claim 1, wherein said N− type doped region underlying said N+ type doped region is formed by a light dopant implantation with doping concentration about $1\times10^{16}$~$3\times10^{17}$/cm$^3$.

3. The method according to claim 1, wherein said N+ type doped region is formed by a heavy dopant implantation with doping concentration about $9\times10^{14}$~$7\times10^{15}$/cm$^3$.

4. The method according to claim 1, wherein said P+ type doped region is formed by a heavy dopant implantation with doping concentration about $8\times10^{14}$~$5\times10^{15}$/cm$^3$.

5. The method according to claim 1, wherein a PMOS anti-punchthrough (PAPT) layer is formed subsequent to forming said N well.

6. The method according to claim 1, wherein an NMOS anti-punchthrough (NAPT) layer is formed subsequent to forming said P well.

7. The method according to claim 1, wherein said field oxide is formed through thermal oxidation.

8. The method according to claim 1, wherein prior to forming a gate oxide layer, $V_T$ implantation is performed to control threshold voltage.

9. The method according to claim 1, wherein said N− type doped regions underlying said N+ type doped region in said P well are formed prior to formation of said gate oxide layer and said polysilicon gate.

10. The method according to claim 5, wherein said P-field regions as drift regions in said PAPT layer cross a portion of said N well.

11. The method according to claim 6, wherein both of said N− type doped regions and N-field regions as drift regions in said NAPT layer cross a portion of said P well.

12. The method according to claim 5, wherein performing a thermal process subsequent to forming said PMOS anti-punchthrough (PAPT) layer densifies said PAPT layer.

13. The method according to claim 6, wherein performing a thermal process subsequent to forming said NMOS anti-punchthrough (NAPT) layer densifies said NAPT layer.

14. The method according to claim 5, wherein said PAPT layer is formed with a thickness about 0.2~0.4 μm.

15. The method according to claim 6, wherein said NAPT layer is formed with a thickness about 0.2~0.4 μm.

* * * * *